United States Patent
Fischl et al.

(10) Patent No.: US 11,032,928 B2
(45) Date of Patent: Jun. 8, 2021

(54) SYSTEM FOR RELEASEABLY CONNECTING A FIRST DEVICE HOUSING WITH A SECOND DEVICE HOUSING AND CONNECTION ARRANGEMENT

(71) Applicant: Rohde & Schwarz GmbH & Co. KG, Munich (DE)

(72) Inventors: Andreas Fischl, Geiersthal (DE); Thomas Walger, Heimstetten (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 300 days.

(21) Appl. No.: 16/220,150

(22) Filed: Dec. 14, 2018

(65) Prior Publication Data
US 2020/0196466 A1    Jun. 18, 2020

(51) Int. Cl.
H05K 5/02    (2006.01)
H05K 5/00    (2006.01)

(52) U.S. Cl.
CPC ......... *H05K 5/0221* (2013.01); *H05K 5/0021* (2013.01)

(58) Field of Classification Search
CPC .................................................. H05K 5/0021
See application file for complete search history.

(56) References Cited

U.S. PATENT DOCUMENTS

| | | | | |
|---|---|---|---|---|
| 2,246,457 A * | 6/1941 | Schultz | ................... | F16B 35/04 403/217 |
| 2,704,680 A * | 3/1955 | Bedford, Jr. | .......... | F16B 37/041 403/299 |
| 3,700,020 A | 10/1972 | Wallace | | |
| 5,630,644 A | 5/1997 | LaPointe et al. | | |
| 5,677,830 A * | 10/1997 | Nogas | ................... | H05K 5/0021 361/732 |

(Continued)

FOREIGN PATENT DOCUMENTS

| | | |
|---|---|---|
| DE | 2942936 A1 | 5/1981 |
| DE | 19806690 A1 | 9/1999 |

(Continued)

OTHER PUBLICATIONS

Extended European search report for counterpart European Patent Application No. 18212600.3, dated Sep. 12, 2019, 13 pages.

*Primary Examiner* — Hung V Ngo
(74) *Attorney, Agent, or Firm* — Westman, Champlin & Koehler, P.A.

(57) ABSTRACT

A system is provided for releaseably connecting a first device housing with a second device housing. The system includes at least three connection units, wherein each of which includes a headed bolt and a corresponding keyhole-shaped recess. The keyhole-shaped recess is configured for receiving the headed bolt such that the headed bolt can be inserted into the recess in a first section and held in the recess in a second section. At least one of the connection units includes a locking mechanism configured for locking the bolt in the second section of the recess. The locking mechanism includes a movable locking element which is movable with respect to the headed bolt and configured to hold the headed bolt in the second section of the recess in a locking position. Another configuration uses a corresponding connection arrangement includes such a system.

16 Claims, 8 Drawing Sheets

(56) References Cited

U.S. PATENT DOCUMENTS

| | | | | |
|---|---|---|---|---|
| 9,241,566 B1* | 1/2016 | Chen | ............... | A47B 47/0083 |
| 2006/0261015 A1* | 11/2006 | Blackwell | ............ | H05K 7/1425 |
| | | | | 211/26 |
| 2014/0340838 A1* | 11/2014 | Deng | ............... | H05K 5/0217 |
| | | | | 361/679.33 |

FOREIGN PATENT DOCUMENTS

| | | |
|---|---|---|
| JP | H04106283 A | 4/1992 |
| WO | 2011026274 A1 | 3/2011 |

* cited by examiner

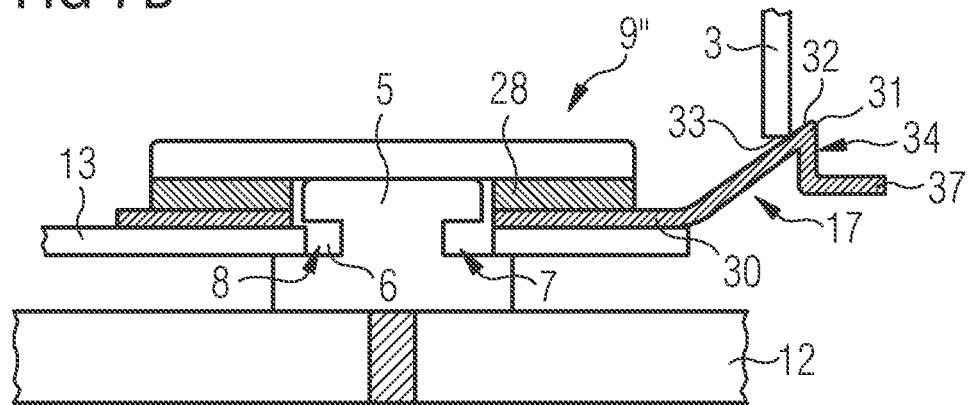
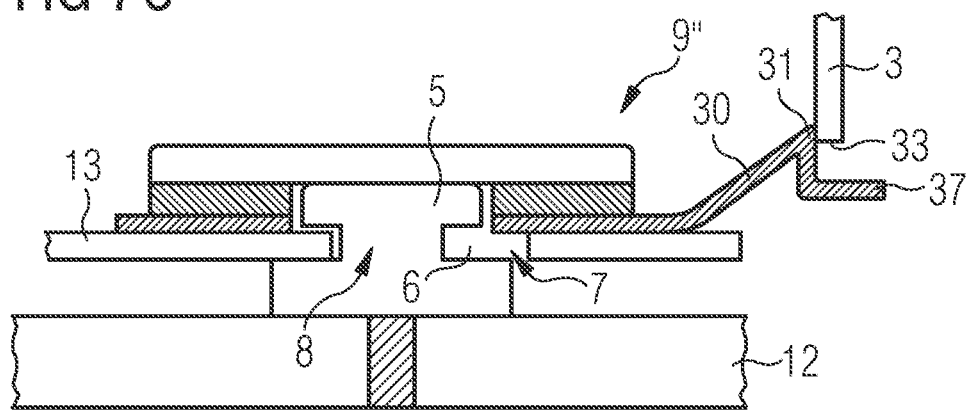

SYSTEM FOR RELEASEABLY CONNECTING A FIRST DEVICE HOUSING WITH A SECOND DEVICE HOUSING AND CONNECTION ARRANGEMENT

FIELD OF THE INVENTION

The present invention relates to a system for releaseably connecting a first device housing with a second device housing. The present invention also relates to a connection arrangement that includes such a system.

BACKGROUND OF THE INVENTION

In device systems, and especially in electronic device systems such as e. g. measurement or communication device systems, housings of multiple devices often have to be connected to each other. Usually, such housings are stacked and the housings of the devices are therefore screwed or bolted together. Often, additional attachment parts such as mounting or fixing brackets are used to connect the housings and to achieve a certain mechanical stability of the stack.

SUMMARY OF THE INVENTION

In view of the above, one of the ideas of the present invention is to provide a new and improved system for releaseably connecting a first device housing with a second device housing, and a connection arrangement that includes such a system.

According to one aspect, therefore, the present invention provides a system for releaseably connecting a first device housing with a second device housing. The system comprises at least three connection units, wherein each of the connection units comprises a headed bolt and a corresponding keyhole-shaped recess. The keyhole-shaped recess is configured for receiving the headed bolt in such a manner that the headed bolt can be inserted into the recess in a first section and held in the recess in a second section. At least one of the connection units comprises a locking mechanism configured for locking the bolt in the second section of the recess. Furthermore, the locking mechanism comprises a movable locking element which is movable with respect to the headed bolt and configured to hold the headed bolt in the second section of the recess in a locking position.

In this way, the invention provides a system which allows a connection of device housings which is mechanically stable and easy to assemble and disassemble. In particular, no tools and no additional attachment parts, such as mounting or fixing brackets, are necessary for assembly and disassembly. Instead, the movable locking element is just moved into an unlocking position to disassemble the housings. In this way, the connection of the housings can be easily disconnected without application of high forces.

Each connection unit of the system comprises two parts, one comprising the headed bolt and one comprising the keyhole-shaped recess, which can be connected in a form fitting manner. Thus, a high strength connection can be provided without necessity for a permanent connection.

With the system of the present invention, a plurality of two, three, four or more device housings may be connected, in particular stacked. For example, the system is configured to connect device housings of similar stand space or footprint, especially similar device housings. In this way, flexibility of use, transportation and even mobile use of corresponding devices housed in the device housings is simplified.

The movable locking element can be configured movable in various ways. For example, the movable locking element can be configured movable by hand or by a moving mechanism. Furthermore, the movable locking element may be configured magnetically movable, movable by an actuator, or the like.

The system may comprise any number of connection units equal to or higher than three connection units. In this way, the system provides for a statically determinate connection of the device housings. Accordingly, a strong connection is provided, in particular without considerable play or backlash.

In an embodiment, the locking mechanism comprises a handle for moving the locking element from the locking position into an unlocking position. In this way, the system allows tool free manipulation of the locking mechanism, in particular for disassembly.

According to an embodiment, the locking element is preloaded by a spring element such that the locking element is resiliently held in the locking position. In this way, the locking element can be provided with an automatic locking function. Accordingly, the locking element may be configured self-locking, in particular as a snap-in locking element.

According to an embodiment, the locking mechanism comprises a locking catch. Such a locking catch may be configured for example to catch the headed bolt in a certain position. Alternatively, the locking catch may be configured to catch the device housing or a latch in a certain position of the locking element. Accordingly, either the headed bolt or the locking element can be automatically locked in a predetermined position.

According to an embodiment, the locking catch is configured to catch the headed bolt in the second section of the recess. Therefore, the locking catch is arranged such that the headed bolt is locked automatically by the locking element when inserted into the keyhole-shaped recess and moved from the first section to the second section.

According to another embodiment, the locking catch is configured to catch or hold the locking element in the locking position. Therefore, the locking catch is in particular arranged such that the locking element is locked automatically when it is moved from an unlocked position to the locking position. For example, the locking catch in the locking position of the locking element catches a predetermined part of the device housing or a latch attached thereto.

According to an embodiment, the locking catch is formed as a ramp or nose with a rising side and an edge. The rising side cooperates either with the headed bolt or the housing while the locking element is moved, preferably such that the locking element is loaded. Once the edge is reached, the locking catch snaps over such that the locking element is automatically locked in the locking position and/or the headed bolt is automatically locked in the second section of the keyhole shaped recess. The locking catch can be released e. g. by moving it manually back over the edge.

According to an embodiment, the locking catch is attached to or integrally formed with the locking element. In this way, the locking catch can be released by manually moving the locking element back into the unlocked position.

According to an embodiment, the locking element is configured as a slider transversely movable with respect to the bolt axis. In particular, the slider is movable only in one translational axis. In this way, the locking element is realized with a very flat design.

In an embodiment, the slider comprises a stop configured to stop the locking element in the locking position. Furthermore, the slider may comprise another stop configured to stop the locking element in the unlocking position. In this way, the locking element has predefined locking and unlocking positions.

According to an embodiment, the first section of the keyhole-shaped recess is wider than the second section and wider than a biggest protruding cross sectional part of the headed bolt, especially the head thereof. In this way, the headed bolt can be easily inserted into the keyhole-shaped recess in the first section and locked in the second section.

According to a further development, the second section of the keyhole-shaped recess is smaller than the biggest protruding cross sectional part of the headed bolt. This biggest protruding cross sectional part is in particular formed as the head of the headed bolt. Preferably, the second section is however big enough to receive a smaller cross-sectional part of the bolt, in particular a smaller or regular bolt diameter. In this way, the bolt can be easily held in the second section.

According to another embodiment, the headed bolt is configured as mushroom headed bolt. The mushroom head design on one hand provides for the desired form lock. On the other hand, the mushroom head design prevents a tendency to stick in the recess, even if the bolt is positioned tilted with respect to the keyhole-shaped recess.

According to a further aspect, the present invention provides a connection arrangement comprising a first device housing and a second device housing coupled to the first device housing with a releasable connecting system. The connecting system comprises at least three connection units, wherein each of the connection units comprises a headed bolt and a corresponding keyhole-shaped recess. The keyhole-shaped recess is configured for receiving the headed bolt in such a manner that the headed bolt can be inserted into the recess in a first section and held in the recess in a second section. At least one of the connection units comprises a locking mechanism configured for locking the bolt in the second section of the recess. The locking mechanism comprises a movable locking element which is movable with respect to the headed bolt and configured to hold the headed bolt in the second section of the recess in a locking position.

As discussed above, the invention is configured to allow a connection of the device housings which is mechanically stable and easy to assemble and disassemble. In particular, no tools and no additional attachment parts such as mounting or fixing brackets are necessary for assembly and disassembly of the arrangement.

The arrangement may also comprise a plurality of more than two device housings, for example three, four or more device housings connected, in particular stacked, by a similar system. For example, each device housing may be equipped with the headed bolts on one side and keyhole-shaped recesses on another side, in particular an opposite side.

Preferably, the device housings have similar stand spaces or footprints. Especially, the device housings may be configured as similar housings.

The device housings may be configured for example as housings for electronic measurement or communication or energy supply device systems. For example, such device systems may comprise MIMO (Multiple Input Multiple Output) devices, battery pack devices, or the like.

With the arrangement of the present invention, flexibility of use, transportation and even mobile use of corresponding devices housed in the device housings is simplified.

In particular, the system of the connection arrangement may comprise the features according to any of the embodiments of a system as described above.

According to a further embodiment, the bolt is fixed to the first device housing. For example, the bolt comprises an outer thread and the first device housing comprises a threaded hole into which the bolt may be screwed. Advantageously, the bolts can therefore be removed from the first device housing, for example if a device is to be used standalone. Alternatively, the bolt may be permanently fixed to the housing, for example welded to the housing.

According to yet a further embodiment, the keyhole-shaped recess is formed in the second housing. In particular, the recess may be formed as a recess of the housing directly in the housing material. In this way, the connection system provides for a very flat integrated design.

According to another aspect, the present invention provides a system for releaseably connecting a first device housing with a second device housing. The system comprises at least three connection units, wherein each of the connection units comprises a headed bolt and a corresponding keyhole-shaped recess. The keyhole-shaped recess is configured for receiving the headed bolt in such a manner that the headed bolt can be inserted into the recess in a first section and held in the recess in a second section. At least one of the connection units comprises a locking mechanism configured for locking the bolt in the second section of the recess. The locking mechanism comprises a flexible buffer element arranged in the second section of the keyhole-shaped recess. The buffer element is configured to load the headed bolt with a frictional force to hold the headed bolt in the second section of the recess in a locking position.

The invention is configured to allow a connection of the device housings which is easy to assemble and disassemble. In particular, no tools and no additional attachment parts such as mounting or fixing brackets are necessary for assembly and disassembly. Instead, the bolt can be loaded with a frictional force by inserting it into the recess in the first section and pushing it into the second section in which the bolt is then held by the frictional force applied by the buffer element.

The buffer element may be configured to allow unlocking of the headed bolt by overcoming the frictional force manually, for example by manually pushing the bolt back from the second section into the first section of the recess.

In particular, the buffer element can be configured more flexible than the keyhole-shaped recess. Especially, the buffer element may be formed of a material different from the material in which the recess is formed. For example, the buffer element may comprise a flexible polymer, such as an elastomer or thermoplastic elastomer. Alternatively or in addition, the buffer element may comprise a spring or spring plate configured to apply a frictional force.

According to a further aspect, the present invention provides a connection arrangement comprising a first device housing and a second device housing coupled to the first device housing with a releasable connecting system. The connecting system comprises at least three connection units, wherein each of the connection units comprises a headed bolt and a corresponding keyhole-shaped recess. The keyhole-shaped recess is configured for receiving the headed bolt in such a manner that the headed bolt can be inserted into the recess in a first section and held in the recess in a second section. At least one of the connection units comprises a locking mechanism configured for locking the bolt in the second section of the recess. Furthermore, the locking mechanism comprises a flexible buffer element arranged in the second section of the keyhole-shaped recess. The buffer element is configured to load the headed bolt with a frictional force to hold the headed bolt in the second section of the recess in a locking position.

As discussed above, the invention is configured to provide a connection of the device housings which is easy to assemble and disassemble. In particular, no tools and no additional attachment parts such as mounting or fixing brackets are necessary for assembly and disassembly. Instead, the bolt can be loaded with a frictional force by inserting it into the recess in the first section and pushing it into the second section in which the bolt is then held by the frictional force applied by the buffer element.

The arrangement may comprise a plurality of more than two device housings, for example three, four or more device housings connected by a similar system, in particular stacked.

Preferably, the device housings have similar stand spaces or footprints. Especially the device housings are configured as similar housings.

In particular, the system of the connection arrangement may comprise the features according to any of the embodiments of a system as described above.

Furthermore, the connection arrangement may comprise the features according to any of the embodiments of an arrangement as described above.

BRIEF DESCRIPTION OF THE DRAWINGS

For a more complete understanding of the invention and the advantages thereof, exemplary embodiments of the invention are explained in more detail in the following description with reference to the accompanying drawing figures, in which like reference characters designate like parts and in which:

FIG. 7B is a schematic longitudinal sectional view of the locking mechanism according to FIG. 7A in an unlocking position;

FIG. 7C is a schematic longitudinal sectional view of the locking mechanism according to FIG. 7A in a locking position;

The accompanying drawings are included to provide a further understanding of the present invention and are incorporated in and constitute a part of this specification. The drawings illustrate particular embodiments of the invention and together with the description serve to explain the principles of the invention. Other embodiments of the invention and many of the attendant advantages of the invention will be readily appreciated as they become better understood with reference to the following detailed description.

It will be appreciated that common and/or well understood elements that may be useful or necessary in a commercially feasible embodiment are not necessarily depicted in order to facilitate a more abstracted view of the embodiments. The elements of the drawings are not necessarily illustrated to scale relative to each other. It will further be appreciated that certain actions and/or steps in an embodiment of a method may be described or depicted in a particular order of occurrences while those skilled in the art will understand that such specificity with respect to sequence is not actually required. It will also be understood that the terms and expressions used in the present specification have the ordinary meaning as is accorded to such terms and expressions with respect to their corresponding respective areas of inquiry and study, except where specific meanings have otherwise been set forth herein.

DETAILED DESCRIPTION OF EMBODIMENTS

Figure 1:
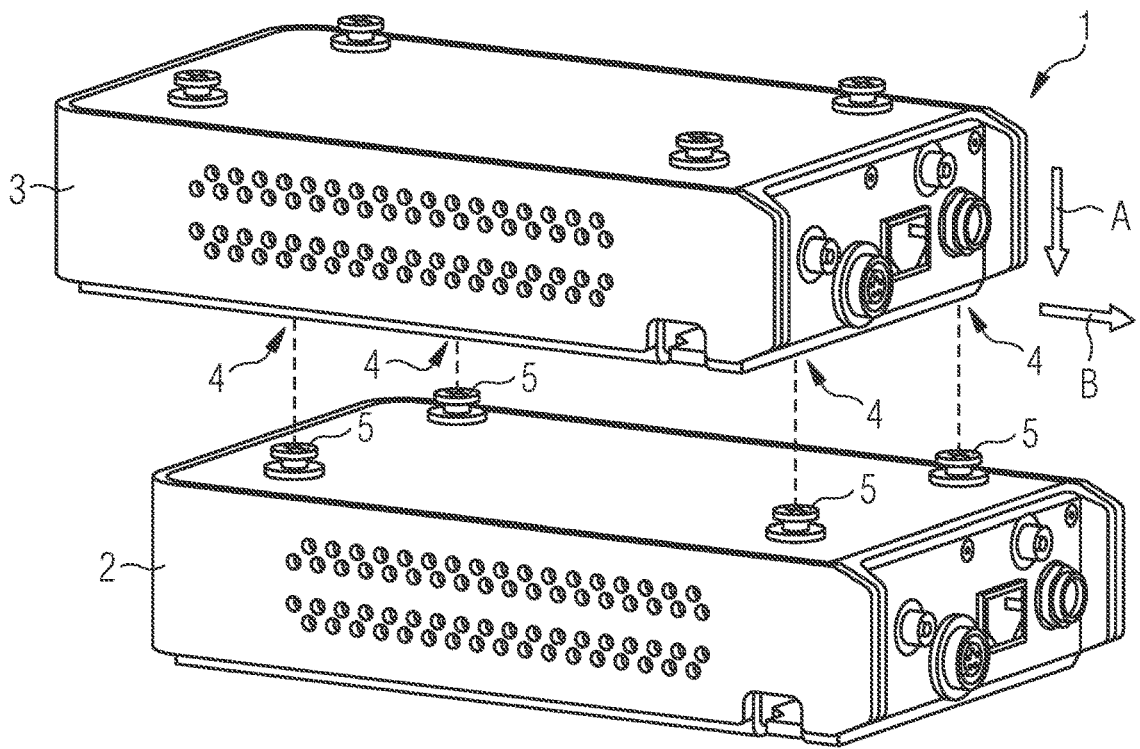
FIG. 1 is a perspective view of a system for releasably connecting a first and a second device housing.

With reference firstly to FIG. 1 of the drawings, a system 1 for releasably connecting a first device housing 2 and a second device housing 3 is illustrated.

The system 1 comprises for example only a number of four connection units 4. In other embodiments, only three or more than four connection units may be provided. However, the system comprises at least 3 connection units.

Each of the connection units comprises a headed bolt 5. Furthermore, each of the connection units 4 comprises a keyhole-shaped recess 6 corresponding to the headed bolt 5.

For example, the bolts 5 according to FIG. 1 are configured as mushroom headed bolts and mounted on an upper side of the device housings 2, 3 and the keyhole-shaped recesses 6 are formed on the bottom side of the device housings 2, 3. Of course, other designs or arrangements of the bolts 5 and recesses 6 are possible in further embodiments as long as they are situated at corresponding interfaces of the device housings 2, 3.

Figure 2:
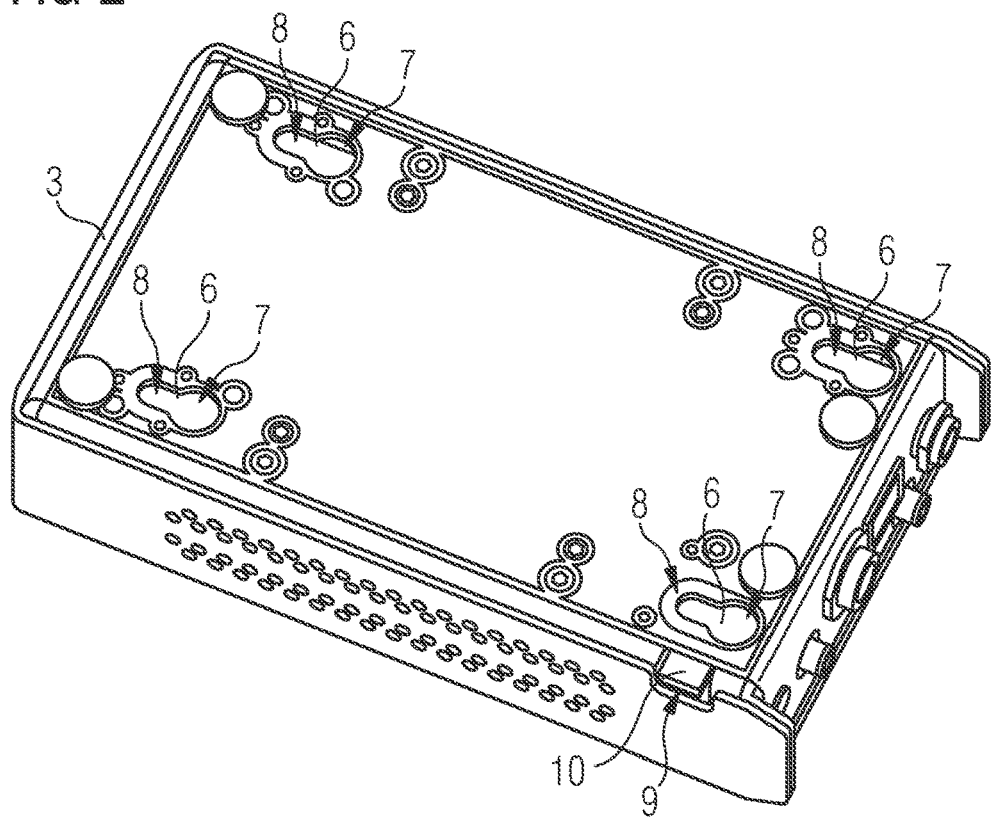
FIG. 2 is a detailed bottom view of the second device housing of FIG. 1.

FIG. 2 is a detailed bottom view of the second device housing 3 of FIG. 1.

As can be seen in this bottom view, the keyhole-shaped recess 6 is configured for receiving the headed bolt 5. The keyhole-shaped recess 6 therefore comprises a first section 7, in which the headed bolt 5 can be inserted into the recess 6. Furthermore, the recess 6 comprises a second section 8 configured to hold the headed bolt in the recess 6. In particular, the second section 8 is configured to positively engage the headed bolt.

The first section 7 of the keyhole-shaped recess 6 is formed wider than the second section 8 and wider than a biggest protruding cross sectional part of the headed bolt 5, formed in particular by the head. Accordingly, the headed bolt 5 can be inserted into the first section 7 of the keyhole-shaped recess 6. Furthermore, the second section 8 of the keyhole-shaped recess 6 is smaller than the head of the headed bolt 5 but big enough to receive a smaller cross-sectional part of the bolt with a smaller bolt diameter such that the bolt can be locked in the second section.

As illustrated by the arrows A and B in FIG. 1, the bolts 5 may be inserted into the recesses 6 by putting a bottom side of the second device housing 3 onto an upper side of the first device housing 2. The second housing 3 is positioned in such a way that the first sections 7 of the recesses are aligned with the headed bolts 5, as illustrated by the dashed lines in FIG. 1.

The second housing 3 may then be lowered relative to the first housing 2 as illustrated by the arrow A. Once the heads of the headed bolts 5 are inserted into the first sections 7 of the recesses 6, the second device housing 3 can be translated in the longitudinal direction as illustrated by the arrow B, parallel to a central axis of the keyhole-shaped recesses 6. In this way, the headed bolts 5 are moved within the recesses 6 from the first sections 7 to the second sections 8 whereby the heads of the headed bolts 5 engage with the material, in particular the housing material, in which the recesses 6 are formed.

One of the connection units 6 comprises a locking mechanism 9 configured for locking the respective headed bolt 5 in the respective second section 8 of the recess 6. By locking this connection unit 4, the complete system can be locked for all connection units 4 due to the statically determinate connection via multiple connection points which locks any translation or rotation. In this way, a connection arrangement 20 can be formed of the first and the second device housings 2, 3 and the connecting system 1.

Figure 3:
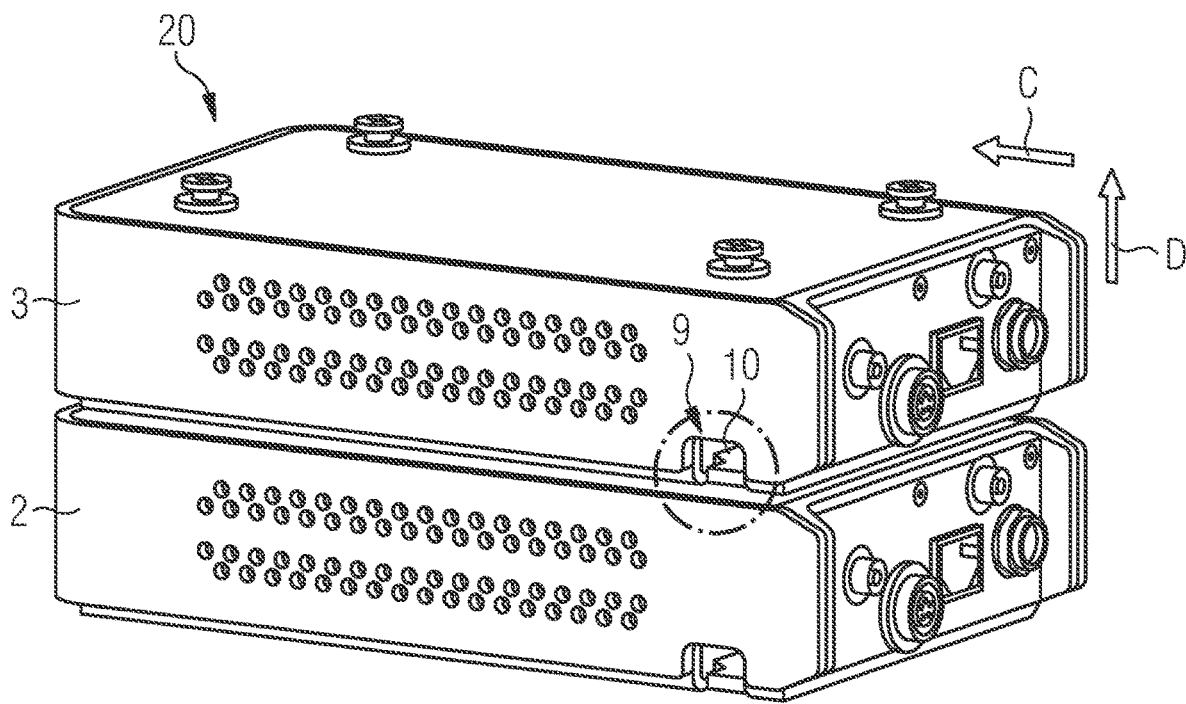
FIG. 3 is a perspective view of a connection arrangement.

FIG. 3 is a perspective view of a connection arrangement 20.

As can be seen in FIG. 3, the first and second device housings 2, 3 are now aligned with each other. Accordingly, the locking mechanism 9 is in a locked state.

However, the locking mechanism 9 comprises a movable locking element 10 which is movable with respect to the headed bolt 5 and configured to hold the headed bolt 5 in the second section 8 of the recess 6 in a locking position.

Figure 4A:
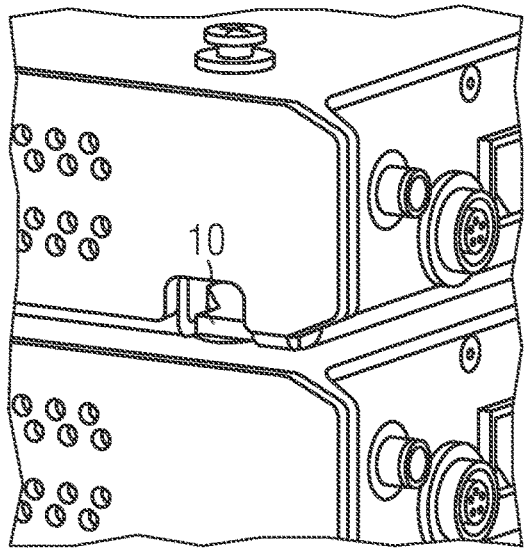
FIG. 4A is a detailed view of a locking element in a locking position.

FIG. 4A is a detailed view of the locking element 10 in a locking position.

The movable locking element 10 can be manually moved from the locking position into an unlocking position.

Figure 4B:
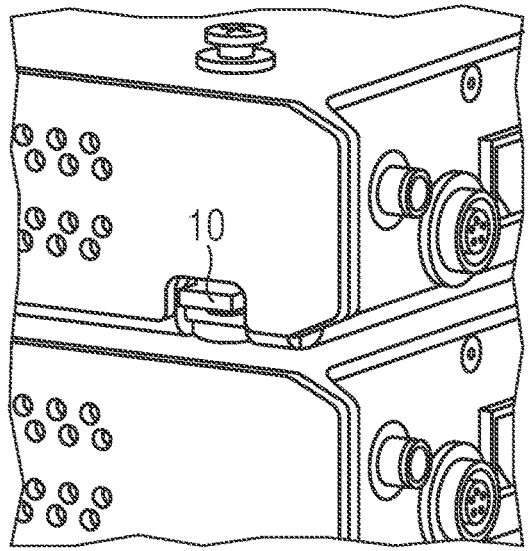
FIG. 4B is a detailed view of the locking element of FIG. 4A in an unlocking position.

FIG. 4B is a detailed view of the locking element 10 of FIG. 4A in an unlocking position.

In the unlocking position of the locking element 10, the headed bolt 5 can be moved back from the second section 8 to the first section 7 of the recess 6 in order to remove it from the recess 6. Therefore, the second device housing 3 can be translated as illustrated by arrow C in FIG. 3 in order to move the headed bolts 5 of all four connection units 4 back into the first sections 7 of the keyhole-shaped recesses 6. The second housing 3 may then be lifted up from the first housing 2, as illustrated by arrow D, to remove the bolts 5 from the recesses 6 and separate the housings 2, 3.

In the same manner as described above, any other plurality of three, four or more device housings may be connected.

Figure 5A:
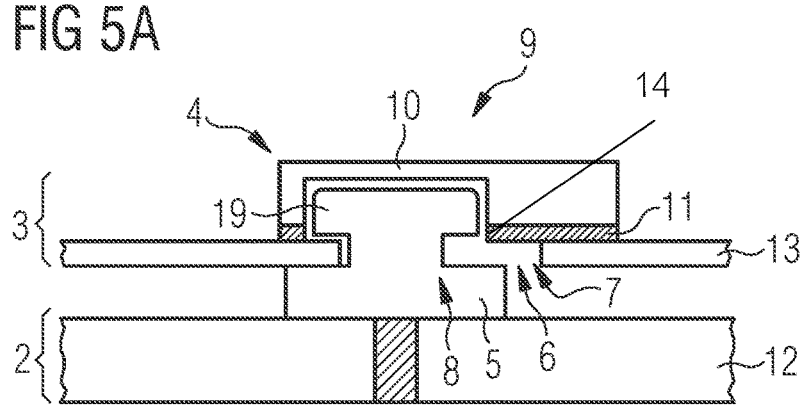
FIG. 5A is a schematic longitudinal sectional view of a locking mechanism according to an embodiment.

FIG. 5A is a schematic longitudinal sectional view of a locking mechanism 9 according to an embodiment.

The locking mechanism 9 with the movable locking element 10 is arranged in a connection unit 4. The keyhole-shaped recess 6 of the connection unit 4 is formed in the bottom wall 13 of the second device housing 3 and the headed bolt 5 of the connection unit 4 is fixed to an upper wall 12 of the first device housing 2.

For example, the bolt 5 comprises an outer thread and the first device housing comprises a threaded hole into which the bolt is screwed.

The locking element is connected with a spring element 11, for example a preloaded spring plate, such that the locking element 10 is resiliently held in the locking position. The locking element 10 of the locking mechanism 9 comprises a locking catch 14, formed as an edge of a recess of the locking element 10. The catch 14 is configured to catch the headed bolt 5, in particular a head 19 of the headed bolt 5, in the second section 8 of the recess 6 when it is inserted into the second section. This means, the headed bolt 5 is locked automatically by the locking element 10 when the head 19 is inserted into the keyhole-shaped recess 6 and moved from the first section 7 to the second section 8.

Figure 5B:
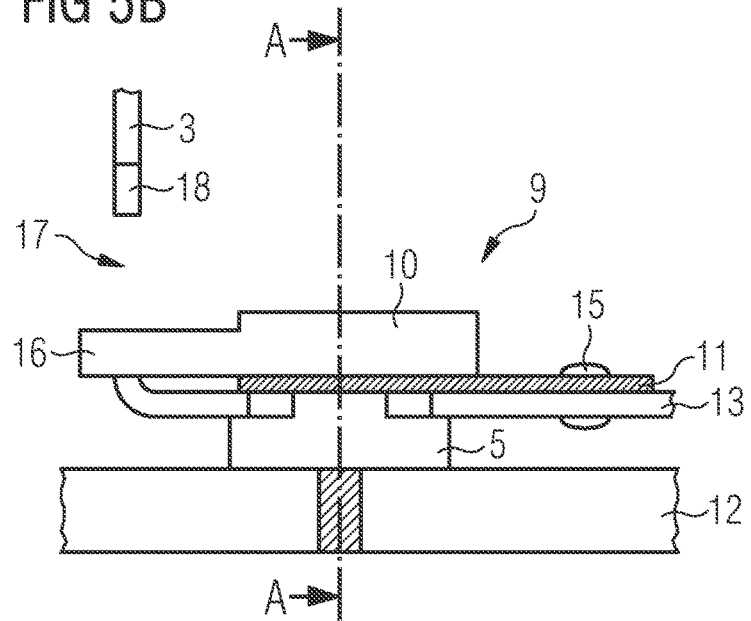
FIG. 5B is a schematic lateral sectional view of the locking mechanism according to FIG. 5A in a locking position.

FIG. 5B is a schematic lateral sectional view of the locking mechanism 9 according to FIG. 5A in the locking position.

As can be seen from the lateral sectional view, the locking element 10 extends through an opening 17 of the second housing 3 and comprises a handle 16 for manual manipulation.

On an opposite side of the locking element 10, the spring element 11 is attached to the bottom wall 13 of the second housing 3 with a fastening element 15. In the shown locking position, the spring element 11 pushes the locking element 10 downwards such that the catch 14 locks the headed bolt 5 in the second section 8 of the recess 6.

Figure 5C:
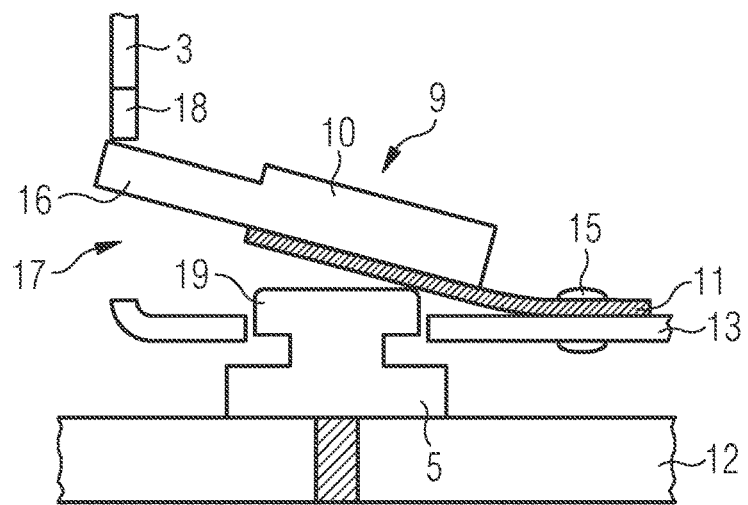
FIG. 5C is a schematic lateral sectional view of the locking mechanism according to FIG. 5A in an unlocking position.

FIG. 5C is a schematic lateral sectional view of the locking mechanism according to FIG. 5A in an unlocking position.

In order to reach the unlocking position, the locking element 10 is pushed upwards at the handle 16 such that it is resiliently tilted against the spring force of the spring element 11. In this way, the locking element 10 is lifted in such a way that the locking catch 14 and the head 19 of the headed bolt 5 disengage. Accordingly, the headed bolt 5 can be moved back from the second section 8 to the first section 7 of the recess 6.

The opening 17 of the second housing 3 comprises a stop 18 which delimits the movement of the locking element 10. In this way, the unlocking position of the locking element is predefined.

Figure 6:
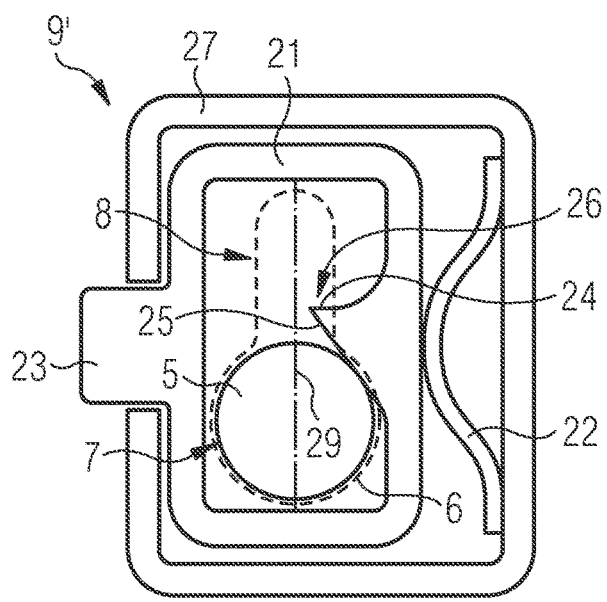
FIG. 6 is a schematic top view of a locking mechanism according to another embodiment.

FIG. 6 is a schematic top view of a locking mechanism 9' according to another embodiment.

This embodiment comprises a locking element 21 configured as a slider transversely movable with respect to the bolt axis and preloaded by a spring element 22. For example the spring element 22 is formed as a wave-formed spring plate resiliently holding the locking element 21 in a locking position. The locking element 21 and the spring element 22 are arranged in a guiding frame 27.

The locking element 21 comprises an integral nose-formed locking catch 24, which is arranged such that the locking element 21 is pushed against the spring element 22 by an interaction between the headed bolt 5 inside the recess 6 and the catch 24. In particular an oblique or rising side 25 of the nose formed catch 24 necessitates a lateral movement of the locking element 21 when the headed bolt 5 is pushed from the first section 7 of the keyhole-shaped recess 6, in which it is depicted in FIG. 6, to the second section 8. When the headed bolt 5 passes an edge 26 of the catch 24, the preloaded locking element 21 snaps back into the locking position and hold the headed bolt 5 in the second section of the recess 6.

In order to disengage the headed bolt 5 again, the locking element 21 can be manually moved in the lateral direction, which is lateral to a longitudinal axis of the recess 6. The locking element can be pushed back against the spring element 22 by pushing a handle 23 thereof and thus moved into an unlocking position.

Figure 7A:
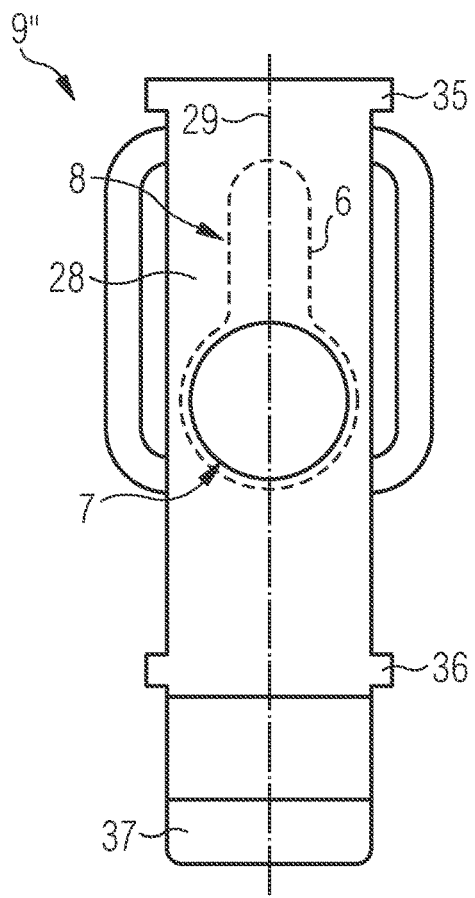
FIG. 7A is a schematic top view of a locking mechanism according to yet another embodiment.

FIG. 7A is a schematic top view of a locking mechanism 9" according to yet another embodiment.

A locking element 28 is also formed as a slider. In contrast to FIG. 6, this locking element 28 is configured to receive the headed bolt inserted into the keyhole-shaped recess 6. If the headed bolt 5 is moved longitudinally along a longitudinal axis 29 of the recess 6, the locking element is similarly translated along this longitudinal axis 29. Accordingly, a sliding direction of the locking element 28 is parallel to the longitudinal axis 29.

FIG. 7A is showing an unlocking position of the locking element 28, which comprises a stop 35 configured to stop the locking element 28 in the unlocking position. Furthermore, another stop 36 is provided to stop the locking element in a predefined locking position.

FIG. 7B is a schematic longitudinal sectional view of the locking mechanism 9" according to FIG. 7A in an unlocking position.

As can be seen in the longitudinal sectional view, a spring element 30 connected to the locking element 28 is also receiving the headed bolt 5 and moving together with the locking element 28. The spring element 30 comprises a ramp or nose formed locking catch 31 and extends through an opening 17 of the second housing 3.

In the unlocking position, the locking catch 31 is arranged outside the opening 17. If the headed bolt 5 is moved or pushed from the first section 7 of the recess 6 into the second section 8, the rising side 32 of the locking catch 31 cooperates with an edge 33 of the opening 17 such that the spring element 30 elastically deforms until an edge 34 of the locking catch 31 snaps over the edge 33 of the opening and engages with the wall of the housing 3. In this way, the headed bolt 5 is automatically locked in the locking position of the locking element 28.

FIG. 7C is a schematic longitudinal sectional view of the locking mechanism 9" according to FIG. 7A in a locking position.

The spring element 30 further comprises a handle 37 that may be pushed downwards in order to disengage the locking catch 31 and the edge 33 of the opening 17. Accordingly, the locking element 28 can be moved back into the unlocking position and the headed bolt 5 can be disengaged.

Figure 8A:
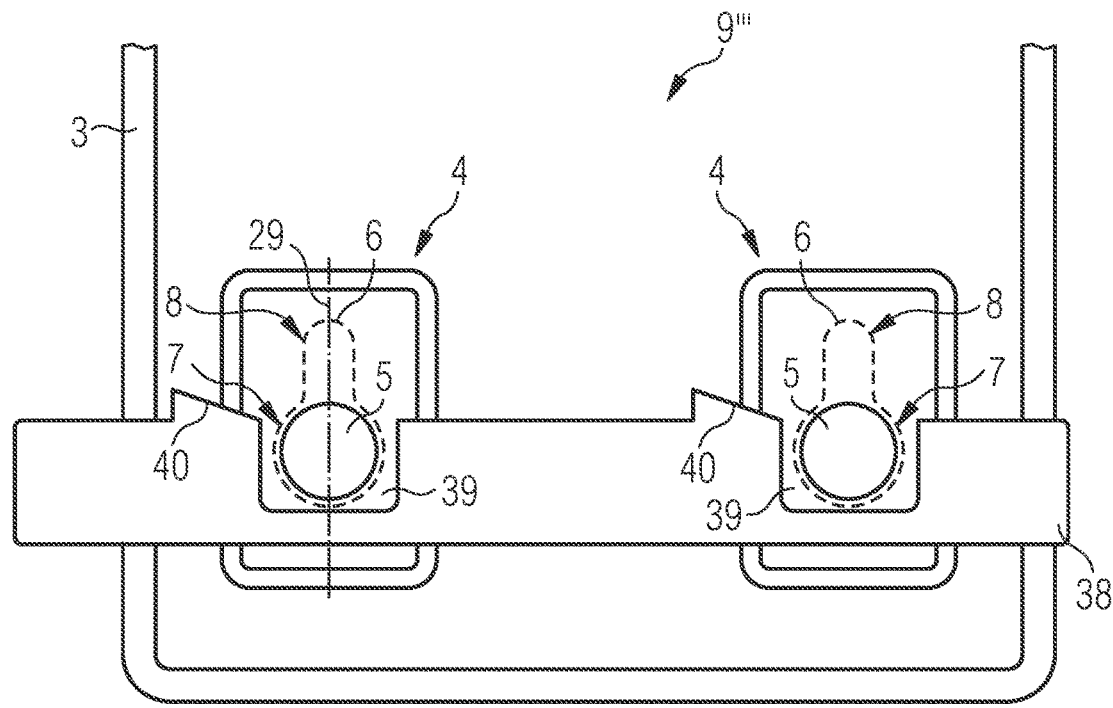
FIG. 8A is a schematic top view of a locking mechanism according to another embodiment in an unlocking position.

FIG. 8A is a schematic top view of a locking mechanism 9''' according to another embodiment in an unlocking position.

The locking element 38 of this embodiment is movable in a direction lateral to the longitudinal axis 29 of the keyhole shaped recesses 6. According to this embodiment, the locking element is configured to lock multiple, for example two, connecting units 4 at the same time. It comprises a recess 39 for each connecting unit 4. The recess 39 is dimensioned such that it allows insertion of the headed bolt 5 into the first section 7 of the keyhole shaped recess 6.

Furthermore, the locking element 38 comprises a latch section 40 for each connection unit 4. After the headed bolt 5 is pushed into the second section 8 of the keyhole shape recess 6, the locking element can be pushed in a lateral direction and moved into a locking position in which the latch sections 40 lock the headed bolt 5 in the second section of the recess 6.

Figure 8B:
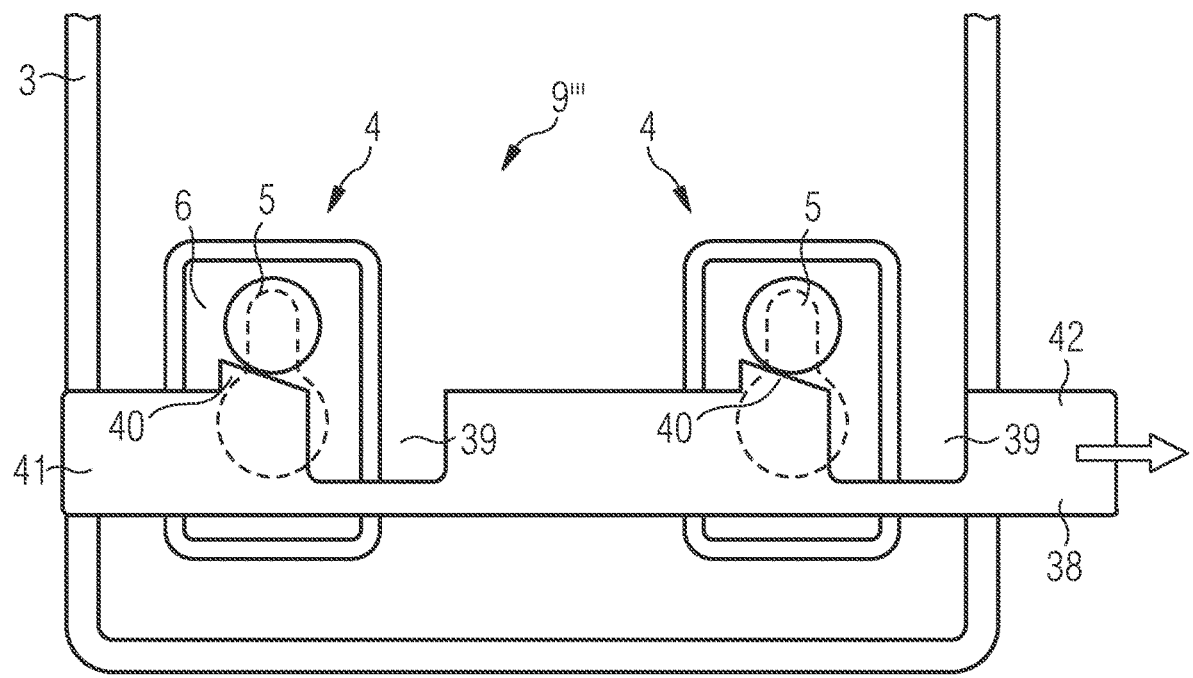
FIG. 8B is a schematic top view of the locking mechanism according to FIG. 8A in a locking position.

FIG. 8B is a schematic top view of the locking mechanism 9''' according to FIG. 8A in a locking position.

The locking element 38 comprises a first handle 41 and a second handle 42. Pushing the first handle 41 moves the locking element 38 from the unlocking position of FIG. 8A into the locking position of FIG. 8B. Pushing the second handle 42 moves the locking element 38 back from the locking position into the unlocking position.

Figure 9A:
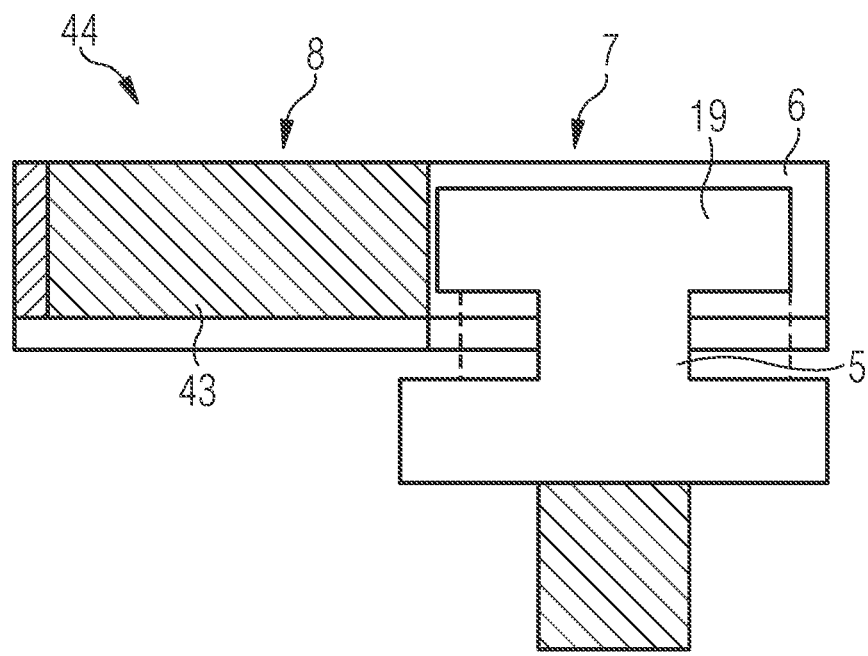
FIG. 9A is a schematic top view of a locking mechanism according to an alternative embodiment.

FIG. 9A is a schematic top view of a locking mechanism 44 according to an alternative embodiment;

According to this embodiment, the locking mechanism 44 instead of a locking element comprises a flexible buffer element 43 arranged in the second section 8 of the keyhole-shaped recess 6.

The buffer element is configured flexible and may load the headed bolt 5 once inserted into the second section 8 of the recess 6 with a frictional force to hold the headed bolt 5 in the second section.

The buffer element is made of flexible material which is fixed, in particular firmly bonded, to the material in which the recess 6 is formed.

Figure 9B:
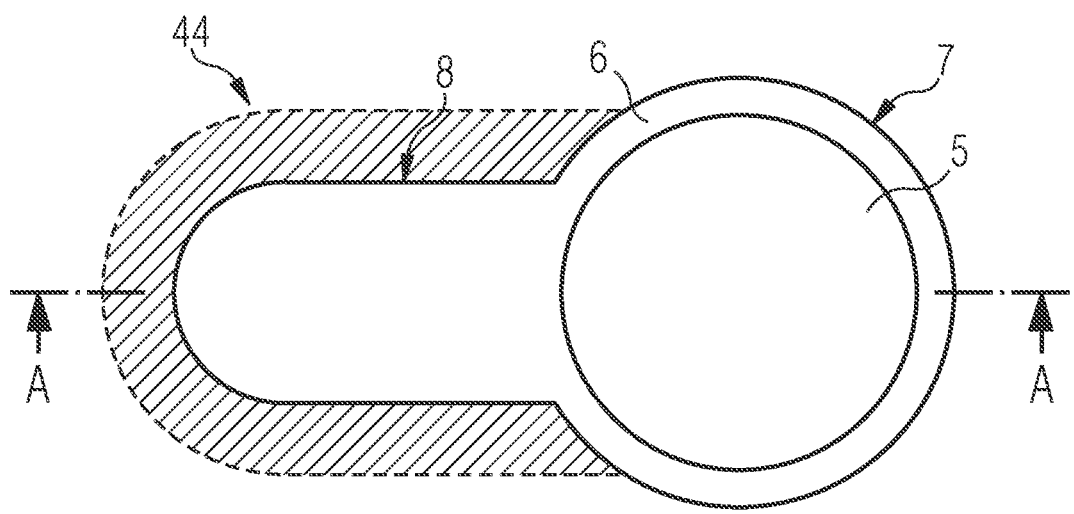
FIG. 9B is a schematic top view of the locking mechanism according to FIG. 9A.

FIG. 9B is a schematic top view of the locking mechanism 44 according to FIG. 9A.

As can be seen from the top view, the buffer element 43 substantially surrounds the second section 8 of the recess 6. In this way, the frictional force can be applied from both sides of the recess to the head 19 of the headed bolt 5.

Figure 10A:
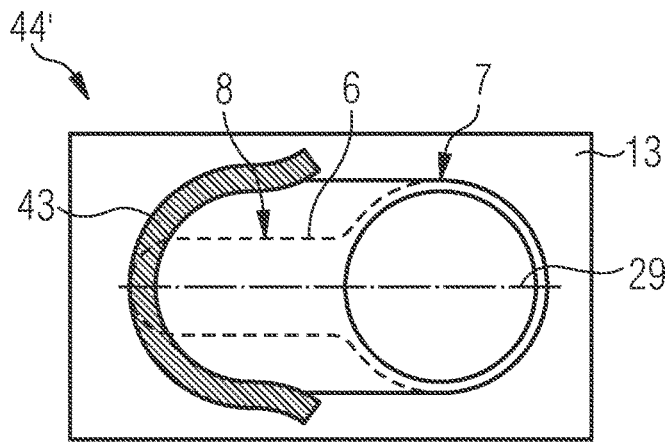
FIG. 10A is a schematic top view of the locking mechanism according to a further alternative embodiment in an unlocking position.

FIG. 10A is a schematic top view of a locking mechanism 44' according to a further alternative embodiment in an unlocking position.

This embodiment basically differs from FIGS. 9A and 9B in that the keyhole shaped recess is formed within a bottom plate 13 of a second housing 3.

In the unlocking position, the headed bolt is inserted into the first section 7 of the keyhole shape recess.

Figure 10B:
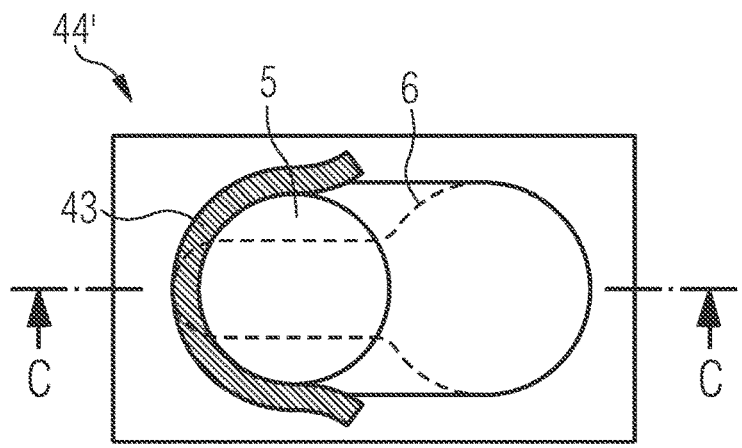
FIG. 10B is a schematic top view of the locking mechanism according to FIG. 10A in a locking position.

FIG. 10B is a schematic top view of the locking mechanism 44' according to FIG. 10A in a locking position.

In order to reach that locking position, the headed bolt 5 is pushed along the longitudinal axis 29 of the recess 6 from the first section 7 into the second section of the keyhole shaped recess 6.

The buffer element 43 arranged in the second section 8 has a bell shape. Therefore, and the headed bolt 5 can be inserted with the comparably small pushing force. When pushed into the bell-shaped buffer element 43, the buffer element elastically deforms such that the headed bolt 5 is frictionally held in a locking position.

Figure 10C:
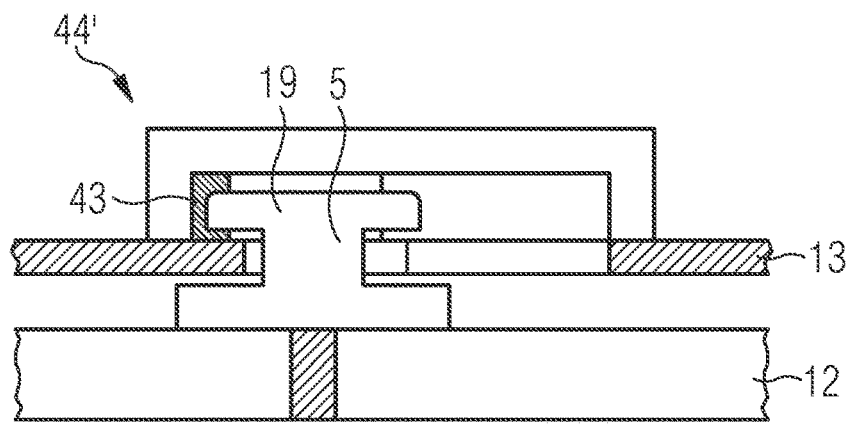
FIG. 10C is a schematic longitudinal sectional view of the locking mechanism according to FIG. 10B.

FIG. 10C is a schematic longitudinal sectional view of the locking mechanism according to FIG. 10B.

As can be seen in the longitudinal section, the head 19 of the bolt 5 is completely surrounded by the buffer element 43 and frictionally held therein by elastic deformation of the buffer element 43.

In order to release the headed bolt 5, a higher pushing force has to be exerted on the bold 5 in an opposite direction parallel to the longitudinal axis 29 of the keyhole shaped recess 6 to overcome the traction between the head 19 and the buffer element 43.

The frictional forces depend especially on the materials of the buffer element 43 and the headed bolt, forming a friction combination. Therefore, the buffer element 43 is preferably formed of a material different from the material in which the recess is formed. For example, the recess can be formed in a metal plate and the buffer element 43 can be made of a polymer material, in particular a thermoplastic and/or elastomer material, in order to provide a maximum frictional coefficient.

Although specific embodiments of the invention are illustrated and described herein, it will be appreciated by those of ordinary skill in the art that a variety of alternate and/or equivalent implementations exist. It should be appreciated that the exemplary embodiment or exemplary embodiments are examples only and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

It will also be appreciated that in this document the terms "comprise", "comprising", "include", "including", "contain", "containing", "have", "having", and any variations thereof, are intended to be understood in an inclusive (i.e. non-exclusive) sense, such that the process, method, device, apparatus or system described herein is not limited to those features or parts or elements or steps recited but may include other elements, features, parts or steps not expressly listed or inherent to such process, method, article, or apparatus. Furthermore, the terms "a" and "an" used herein are intended to be understood as meaning one or more unless explicitly stated otherwise. Moreover, the terms "first", "second", "third", etc. are used merely as labels, and are not intended to impose numerical requirements on or to establish a certain ranking of importance of their objects.

The invention claimed is:

1. A system for releaseably connecting a first device housing with a second device housing, comprising:
at least three connection units,
wherein each of the connection units comprises a headed bolt and a corresponding keyhole-shaped recess configured for receiving the headed bolt in such a manner that the headed bolt can be inserted into the recess in a first section and held in the recess in a second section,
wherein at least one of the connection units comprises a locking mechanism configured for locking the bolt in the second section of the recess, and
wherein the locking mechanism comprises a movable locking element which is movable with respect to the headed bolt and configured to hold the headed bolt in the second section of the recess in a locking position;
wherein the locking mechanism comprises a locking catch configured to catch the headed bolt in the second section of the recess.

2. The system of claim 1, wherein the locking mechanism comprises a handle for moving the locking element from the locking position into an unlocking position.

3. The system of claim 1, wherein the locking element is preloaded by a spring element such that the locking element is resiliently held in the locking position.

4. The system of claim 1, wherein the locking catch is configured to catch or hold the locking element in the locking position.

5. The system of claim 1, wherein the locking catch is formed as a ramp or nose with a rising side and an edge.

6. The system of claim 1, wherein the locking catch is attached to or integrally formed with the locking element.

7. The system of claim 1, wherein the locking element is configured as a slider transversely movable with respect to the bolt axis.

8. The system of claim 1, wherein the first section of the keyhole-shaped recess is wider than the second section and wider than a biggest protruding cross sectional part of the headed bolt.

9. The system of claim 1, wherein the second section of the keyhole-shaped recess is smaller than the biggest protruding cross sectional part of the headed bolt.

10. The system of claim 1, wherein the headed bolt is configured as mushroom headed bolt.

11. A connection arrangement, comprising a first device housing and a second device housing coupled to the first device housing with a releasable connecting system, the connecting system comprising:
at least three connection units arranged at an interface between the first device housing and the second device housing,
wherein each of the connection units comprises a headed bolt and a corresponding keyhole-shaped recess configured for receiving the headed bolt in such a manner that the headed bolt can be inserted into the recess in a first section and held in the recess in a second section,
wherein at least one of the connection units comprises a locking mechanism configured for locking the bolt in the second section of the recess, and
wherein the locking mechanism comprises a movable locking element which is movable with respect to the headed bolt and configured to hold the headed bolt in the second section of the recess in a locking position,
wherein the locking mechanism comprises a locking catch configured to catch the headed bolt in the second section of the recess.

12. The arrangement of claim 11, wherein the bolt is fixed to the first device housing.

13. The arrangement of claim 11, wherein the keyhole-shaped recess is formed in the second housing.

14. A system for releaseably connecting a first device housing with a second device housing, comprising:
at least three connection units,
wherein each of the connection units comprises a headed bolt and a corresponding keyhole-shaped recess configured for receiving the headed bolt in such a manner that the headed bolt can be inserted into the recess in a first section and held in the recess in a second section,
wherein at least one of the connection units comprises a locking mechanism configured for locking the bolt in the second section of the recess,
wherein the locking mechanism comprises a flexible buffer element arranged in the second section of the keyhole-shaped recess, and
wherein the buffer element is configured to load the headed bolt with a frictional force to hold the headed bolt in the second section of the recess in a locking position.

15. The system of claim 14, wherein the buffer element is configured more flexible than the keyhole-shaped recess.

16. A connection arrangement, comprising a first device housing and a second device housing coupled to the first device housing with a releasable connecting system, the connecting system comprising:
at least three connection units arranged at an interface between the first device housing and the second device housing,
wherein each of the connection units comprises a headed bolt and a corresponding keyhole-shaped recess configured for receiving the headed bolt in such a manner that the headed bolt can be inserted into the recess in a first section and held in the recess in a second section, wherein at least one of the connection units comprises a locking mechanism configured for locking the bolt in the second section of the recess, wherein the locking mechanism comprises a flexible buffer element arranged in the second section of the keyhole-shaped recess, and wherein the buffer element is configured to load the headed bolt with a frictional force to hold the headed bolt in the second section of the recess in a locking position.

* * * * *